United States Patent [19]
Liu et al.

[11] Patent Number: 5,838,030
[45] Date of Patent: Nov. 17, 1998

[54] GAINP/GAINAS/GAAS MODULATION-COMPOSITIONED CHANNEL FIELD-EFFECT TRANSISTOR

[75] Inventors: Wen-Chau Liu; Lih-Wen Laih, both of Tainan, Taiwan

[73] Assignee: National Science Council, Taiwan

[21] Appl. No.: 925,863

[22] Filed: Sep. 9, 1997

[30] Foreign Application Priority Data

May 6, 1997 [TW] Taiwan ................................. 86106024

[51] Int. Cl.⁶ ........................ H01L 29/772; H01L 29/812
[52] U.S. Cl. ........................................... 257/192; 257/191
[58] Field of Search .................... 257/191, 192, 257/194, 472, 473

[56] References Cited

U.S. PATENT DOCUMENTS

| 5,091,759 | 2/1992 | Shih et al. | 257/194 |
| 5,206,527 | 4/1993 | Kuwata | 257/191 |
| 5,331,410 | 7/1994 | Kuwata | 257/191 |

OTHER PUBLICATIONS

D. Geiger, et al., "InGaP/InGaAs HFET with High Current Density and High Cut–Off Frequencies," IEEE Electron Device Lett., vol. 16, No. 6, pp. 259–261.

Y. Chan, et al., Al0.3Ga0.7As/InxGa1–xAs (0<x<0.25) Doped–Channel Field–Effect Transistors (DCFET's), IEEE Trans. Electron Devices, vol. 42, No. 10, Oct. 1995,pp. 1745–1749.

*Primary Examiner*—John Guay
*Attorney, Agent, or Firm*—Randall J. Knuth

[57] ABSTRACT

The present invention provides a GaInP/GaInAs/GaAs modulation-compositioned channel field-effect transistor which comprises: a substrate of semi-insulated GaAs material; a first layer of non-doped GaAs material, formed on the substrate; a second layer of n-doped GaInAs material, formed on the first layer; a third layer of non-doped GaInP material, formed on the second layer; a fourth layer of n-doped GaAs material, formed on the third layer; an Au layer, formed on the third layer; and an Au/Ge/Ni alloy layer, formed on the fourth layer. An accumulation effect is performed because there is a V-shaped energy band existing in the modulation-compositioned channel. Therefore, the transistor of the present invention is characterized by a large current density, a large gate voltage swing with high transconductance, and a high gate breakdown voltage. The present invention has a good potentiality for high-speed, high-power, and large input signal circuit applications.

12 Claims, 3 Drawing Sheets

GAINP/GAINAS/GAAS MODULATION-COMPOSITIONED CHANNEL FIELD-EFFECT TRANSISTOR

BACKGROUND OF THE INVENTION

1. Field of the Invention

The present invention relates to a field-effect transistor, and especially relates to a GaInP/GaInAs/GaAs modulation-compositioned channel field-effect transistor with high current density, large gate voltage swing with high transconductance, and high gate breakdown voltage.

2. Description of the Related Art

Recently, developments and researches on III–V group heterostructure field-effect transistor (HFET) are concentrated on modulation-doped field-effect transistor (MODFET) or high-electron mobility transistor (HEMT). Although MODFET has advantages of a large transconductance and high electron mobility, it still has disadvantages of a low current density, and a small gate voltage swing. In order to overcome these disadvantages, a doped-channel field-effect transistor (DCFET) is developed in the prior art.

But DCFET still has its disadvantages. Its current density and gate voltage swing are not adequate, and its pinch-off voltage is a little bit lower.

Therefore, there is a need to develop a new FET which has a high current density, a large gate voltage swing with high transconductance, and a high gate breakdown voltage.

SUMMARY OF THE INVENTION

The main object of the present invention is to provide a GaInP/GaInAs/GaAs modulation-compositioned channel field-effect transistor (MCCFET) with a high current density, a large gate voltage swing with high transconductance, and a high gate breakdown voltage.

In the present invention, there are effective carriers accumulated in the modulation-compositioned channel, and thus a high current density is obtained under a lower doped concentration. Due to the existence of a large conduction band discontinuity ($\Delta Ec$), a gate breakdown voltage of the present invention is largely increased. So, the present invention is suitable for a lot of applications.

The present invention provides a GaInP/GaInAs/GaAs modulation-compositioned channel field-effect transistor which comprises: a substrate of GaAs material; a first layer of GaAs material, formed on the substrate; a second layer of GaInAs material, formed on the first layer; a third layer of GaInP material, formed on the second layer; a fourth layer of GaAs material, formed on the third layer; an Au layer, formed on the third layer; and a Au/Ge/Ni alloy layer, formed on the fourth layer.

DESCRIPTION OF THE DRAWINGS

Other objects, features, and advantages of the present invention will become apparent from the following detailed description made with reference to an illustrative but non-restrictive embodiment. The description is made with reference to the accompanying drawings, in which.

DESCRIPTION OF THE PREFERRED EMBODIMENT

Figure 1:
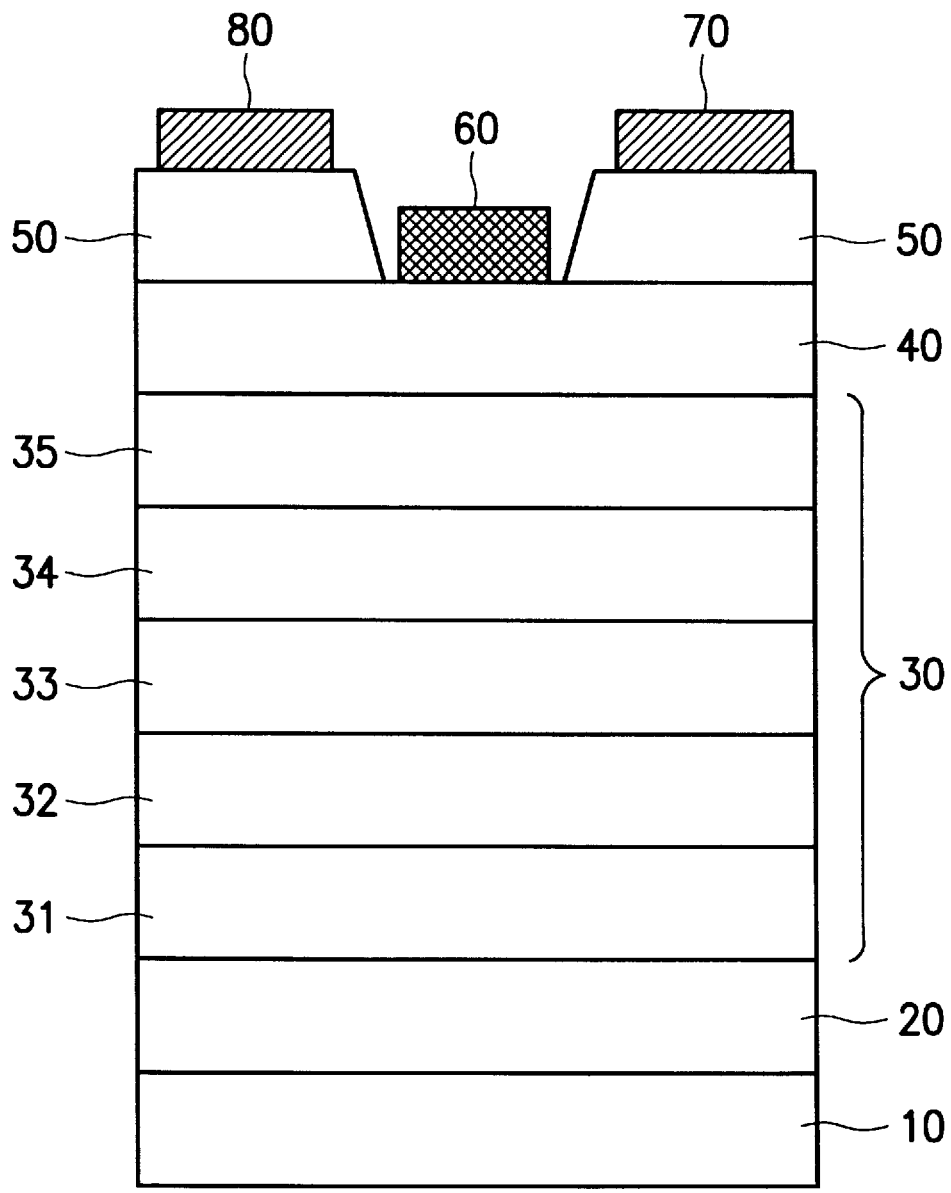
FIG. 1 depicts a structure diagram of the GaInP/GaInAs/GaAs modulation-compositioned channel field-effect transistor of the present invention.

FIG. 1 depicts a structure diagram of the present invention. Now refer to FIG. 1, in the present invention, a GaInP/GaInAs/GaAs modulation-compositioned channel field-effect transistor comprises: a semi-insulated GaAs substrate 10; a non-doped GaAs buffer layer 20, formed on the GaAs substrate 10; an n-doped $Ga_{1-x}In_xAs$ layer 30, formed on the GaAs buffer layer 20; a non-doped $Ga_{0.51}In_{0.49}P$ layer 40, formed on the $Ga_{1-x}In_xAs$ layer 30; an n-doped GaAs layer 50, formed on the $Ga_{0.51}In_{0.49}P$ layer 40; an Au metal layer 60, formed on the $Ga_{0.51}In_{0.49}P$ layer 40; and two Au/Ge/Ni alloy layers 70, 80, formed on the n-doped GaAs layer 50. The non-doped GaAs buffer layer 20 has a thickness 0.5 $\mu$m. The n-doped $Ga_{1-x}In_xAs$ layer 30 has a concentration of $5 \times 10^{17}$ cm$^{-3}$. The non-doped $Ga_{0.51}In_{0.49}P$ layer 40 has a thickness of 300 Å. The n-doped GaAs layer 50 has a thickness of 300 Å and $4 \times 10^{18}$ cm$^{-3}$. The Au metal layer 60 is used as a gate, and constitutes a schottky contact with the non-doped $Ga_{0.51}In_{0.49}P$ layer 40. The Au/Ge/Ni alloy layers 70 and 80 are acted as a drain/source region, and constitutes an ohmic contact with the n-doped GaAs layer 50.

Figure 2:
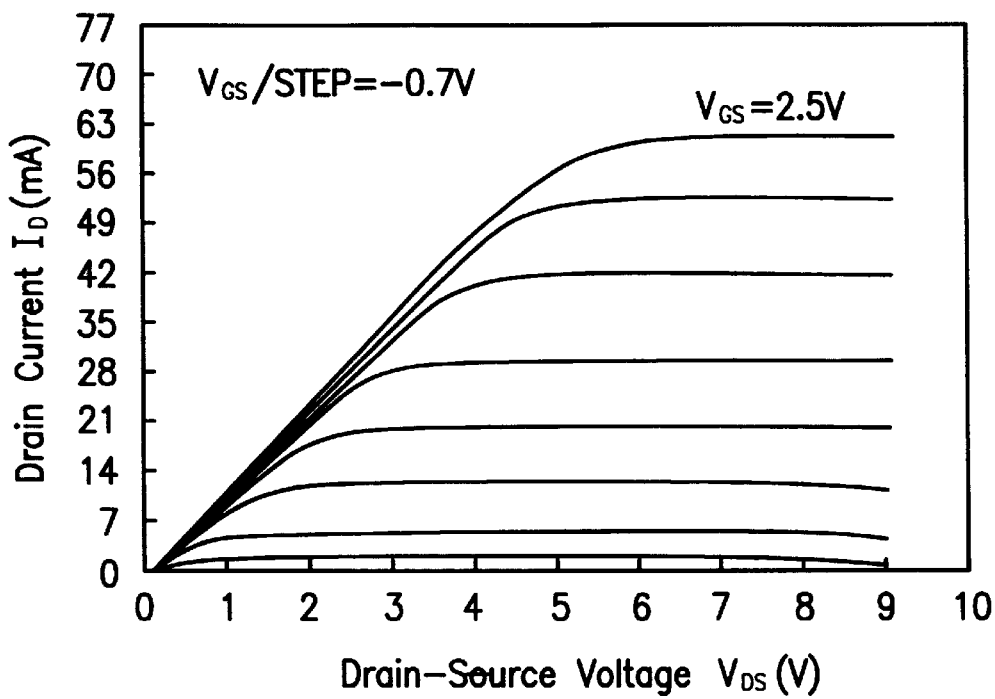
FIG. 2 depicts a current-voltage characteristic of the present invention.

FIG. 2 depicts a current-voltage characteristic of the present invention. In FIG. 2, the abscissa represents the drain-source voltage $V_{DS}$ with each scale of 1V; and the ordinate represents the drain current $I_D$ with each scale of 7 mA. The gate-source voltage $V_{GS}$ is $-0.7$V/step. In the present invention, the maximum gate voltage is 3.2V, and the threshold voltage is $-2.7$V.

Figure 3:
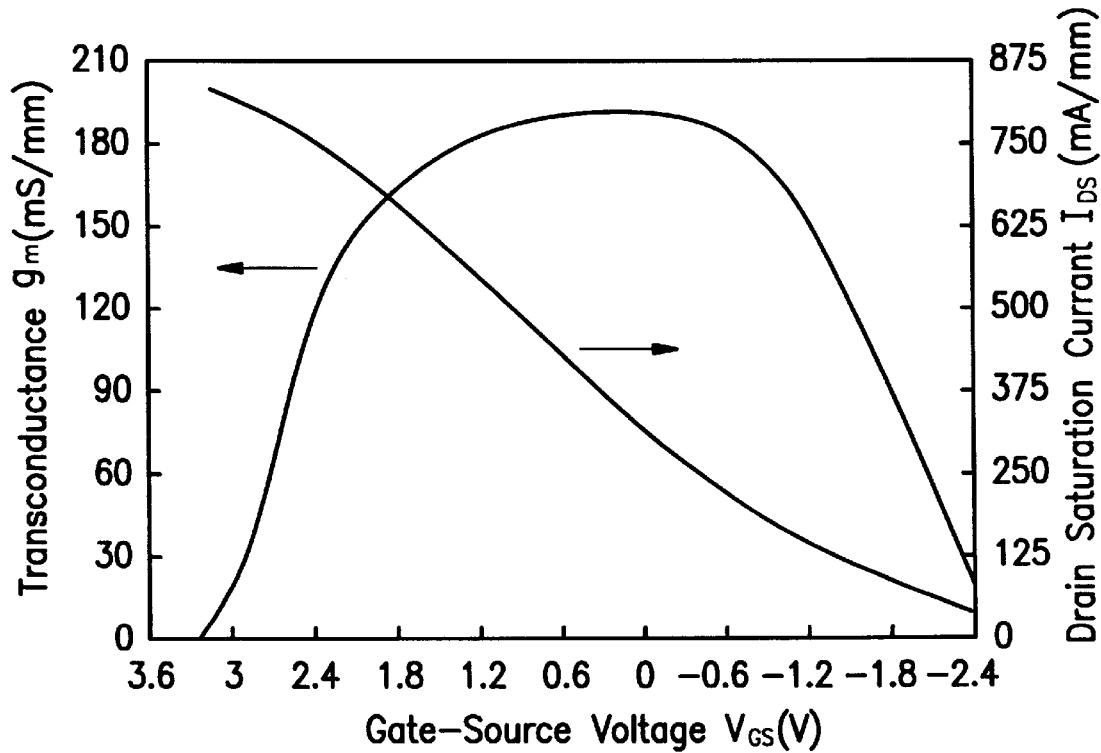
FIG. 3 depicts a relation of drain saturation current and transconductance vs. gate voltage when the drain-source voltage is 7V.

FIG. 3 depicts a relation of drain saturation current $I_{DS}$ and transconductance $g_m$ vs. gate voltage $V_G$ when the drain-source voltage $V_{DS}$ is 7V. In FIG. 3, the abscissa represents the gate-source voltage $V_{GS}$ with each scale of 0.6V; and the left and right ordinate respectively represent the transconductance $g_m$ with each scale of 30 mS/mm and drain saturation current $I_{DS}$ with each scale of 125 mA/mm. When the transistor of the present invention has a gate length of 0.8 $\mu$m and a width of 100 $\mu$m, the maximal drain saturation current and transconductance are 830 mA/mm and 188 mS/mm, respectively. The drain saturation current curve has a good linearity.

Figure 4:
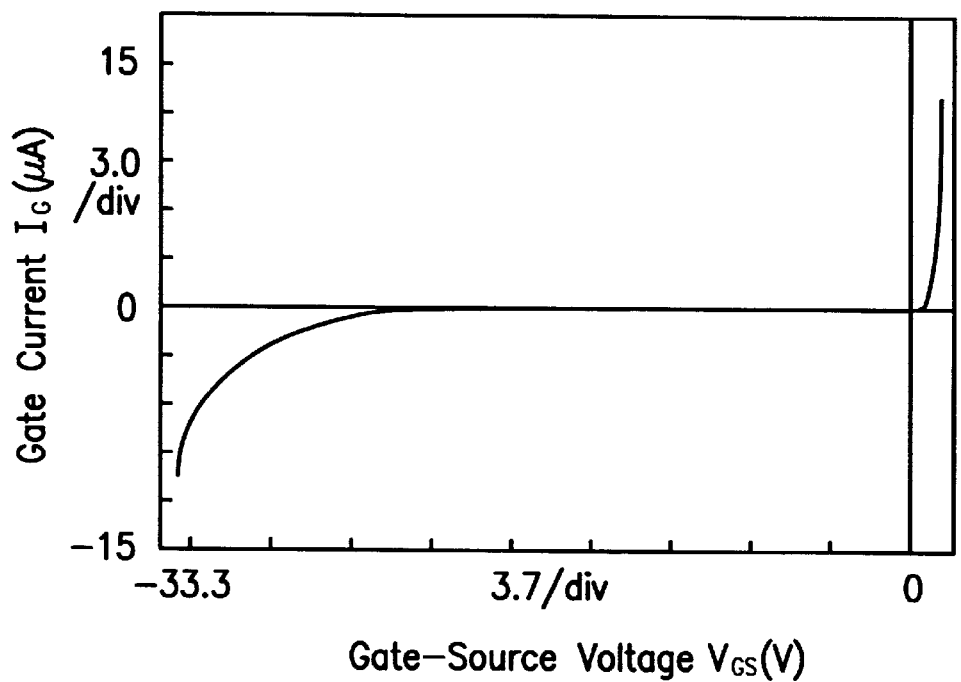
FIG. 4 depicts a current-voltage characteristic of gate voltage of the present invention.

FIG. 4 depicts a two-terminal current-voltage characteristic of gate, wherein the abscissa represents the gate-drain voltage $V_{DS}$ with each scale of 3.7V; and the ordinate represents the gate current $I_G$ with each scale of 3.0 $\mu$A. From FIG. 4, it is known that gate breakdown voltage is as high as 34V. This physical phenomenon is explained from the energy band diagram shown in FIG. 5.

Figure 5:
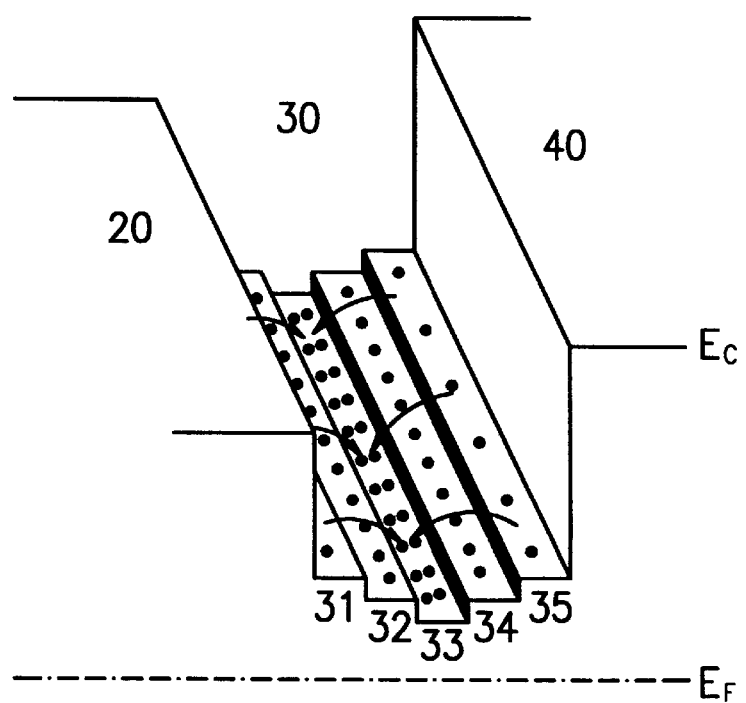
FIG. 5 depicts a structure diagram of the V-shaped energy band in the modulation-compositioned channel of the present invention.

FIG. 5 depicts a structure diagram of the V-shaped energy band in the modulation-compositioned channel of the present invention, wherein there are five composition layers 31, 32, 33, 34, and 35 in the channel. In FIG. 5, Ec and $E_F$ respectively represent the conductance band energy level, and the Fermi energy level. The higher Indium (In) mole ratio in the modulation-compositioned channel, the lower the energy gap. The carriers are accumulated in the composition layer 33 which has an In mole ratio of 0.2. Thus, the present invention has a high current density under a low doped concentration. Due to a great conduction band discontinuity (ΔEc) at the GaInP/GaInAs junction, electrons are more effectively confined in the channel, and the gate breakdown voltage is largely increased.

Because of the existence of a modulation-compositioned channel existing in the present invention, a large drain saturation current, a high transconductance, a large breakdown voltage, and a wide gate voltage swing are obtained. Thus, the present invention is suitable for high-speed, high-power, and large input signal circuit applications.

The invention has been described in connection with preferred embodiments, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical applications, thereby enabling those skilled in the art to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A GaInP/GaInAs/GaAs modulation-compositioned channel field-effect transistor, comprising:
    a substrate of GaAs material;
    a first layer of GaAs material, formed on said substrate;
    a second layer of GaInAs material, formed on said first layer;
    a third layer of GaInP material, formed on said second layer;
    a fourth layer of GaAs material, formed on said third layer;
    a first metal layer, formed on said third layer;
    a second metal layer, formed on said fourth layer; and
    wherein second layer is comprised of five layers, each with a thickness of approximately 30 Å, and the mole ratio of In of said five layers is approximately 0.1, 0.15, 0.2, 0.15, and 0.1, respectively.

2. The GaInP/GaInAs/GaAs modulation-compositioned channel field-effect transistor of claim 1, wherein said substrate is comprised of semi-insulated GaAs material.

3. The GaInP/GaInAs/GaAs modulation-compositioned channel field-effect transistor of claim 1, wherein said first layer is comprised of non-doped GaAs material, and used as a buffer layer.

4. The GaInP/GaInAs/GaAs modulation-compositioned channel field-effect transistor of claim 3, wherein said first layer has a thickness of 0.5 μm.

5. The GaInP/GaInAs/GaAs modulation-compositioned channel field-effect transistor of claim 1, wherein said second layer is comprised of n-doped GaInAs material.

6. The GaInP/GaInAs/GaAs modulation-compositioned channel field-effect transistor of claim 1, wherein said third layer is comprised of non-doped GaInP material.

7. The GaInP/GaInAs/GaAs modulation-compositioned channel field-effect transistor of claim 6, wherein said third layer has an In/Ga mole ratio of 49:51 and a thickness of 300 Å.

8. The GaInP/GaInAs/GaAs modulation-compositioned channel field-effect transistor of claim 1, wherein said fourth layer is comprised of n-doped GaAs material.

9. The GaInP/GaInAs/GaAs modulation-compositioned channel field-effect transistor of claim 8, wherein said fourth layer has a thickness of 300 Å, and a concentration of $4 \times 10^{18}$ cm$^{-3}$.

10. The GaInP/GaInAs/GaAs modulation-compositioned channel field-effect transistor of claim 1, wherein said first metal layer, as a gate, is comprised of Au, and forming a schottky contact with said third layer.

11. The GaInP/GaInAs/GaAs modulation-compositioned channel field-effect transistor of claim 1, wherein said second metal layer, as a drain/source region, is comprised of Au/Ge/Ni alloy, and forming an ohmic contact with said fourth layer.

12. A GaInP/GaInAs/GaAs modulation-compositioned channel field-effect transistor, comprising:
    a substrate of GaAs material;
    a first layer of GaAs material, formed on said substrate;
    a second layer of GaInAs material, formed on said first layer;
    a third layer of GaInP material, formed on said second layer;
    a fourth layer of GaAs material, formed on said third layer;
    a first metal layer, formed on said third layer;
    a second metal layer, formed on said fourth layer;
    wherein said second layer is comprised of n-doped GaInAs material; and
    wherein said second layer has a concentration of $5 \times 10^{17}$ cm$^{-3}$.

* * * * *